(12) United States Patent
GopalaKrishnaSetty et al.

(10) Patent No.: US 10,527,674 B2
(45) Date of Patent: ***Jan. 7, 2020

(54) CIRCUIT STRUCTURES TO RESOLVE RANDOM TESTABILITY

(71) Applicant: International Business Machines Corporation, Armonk, NY (US)

(72) Inventors: Raghu G. GopalaKrishnaSetty, Bangalore (IN); Mary P. Kusko, Hopewell Junction, NY (US); Spencer K. Millican, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,626

(22) Filed: Aug. 21, 2017

(65) Prior Publication Data

US 2019/0056449 A1  Feb. 21, 2019

(51) Int. Cl.
*G01R 31/28* (2006.01)
*G01R 31/3183* (2006.01)
*G06F 17/50* (2006.01)
*G01R 31/3185* (2006.01)

(52) U.S. Cl.
CPC ........ *G01R 31/318307* (2013.01); *G01R 31/318342* (2013.01); *G01R 31/318583* (2013.01); *G06F 17/5022* (2013.01); *G06F 2217/14* (2013.01)

(58) Field of Classification Search
CPC ........ G01R 31/318385; G01R 31/3185; G01R 31/318378; G01R 31/318547; G01R 31/31813; G01R 31/3187; G01R 31/318307; G01R 31/318342; G01R 31/318583; G06F 11/263; G06F 11/27; G06F 17/5022

See application file for complete search history.

(56) References Cited

U.S. PATENT DOCUMENTS

| 5,450,414 | A | 9/1995 | Lin | |
|---|---|---|---|---|
| 6,532,571 | B1* | 3/2003 | Gabrielson | G01R 31/31835 714/726 |
| 6,874,112 | B1 | 3/2005 | Schmitz | |
| 9,041,411 | B2 | 5/2015 | Marinissen et al. | |
| 2003/0149927 | A1* | 8/2003 | Wang | G06F 11/263 714/738 |
| 2003/0154432 | A1* | 8/2003 | Scott | G01R 31/318385 714/724 |

(Continued)

OTHER PUBLICATIONS

Bakshi, "Techniques for Seed Computation and Testability Enhancement for Logic Built-In Self Test" Virginia Polytechic Institute and State University Aug. 27, 2012, 80 pages.

(Continued)

*Primary Examiner* — Guerrier Merant
(74) *Attorney, Agent, or Firm* — Cantor Colburn LLP; William Kinnaman

(57) ABSTRACT

Embodiments include techniques for using circuit structures for resolving random testability, the techniques includes analyzing a logic structures of a circuit design, and identifying the logic structures of the circuit that are random resistant structures. The techniques also include replacing the logic structures with random testable structures, and performing a test of the circuit design.

10 Claims, 14 Drawing Sheets

(56) References Cited

U.S. PATENT DOCUMENTS

| | | |
|---|---|---|
| 2005/0081130 A1* | 4/2005 | Rinderknecht .......................... G01R 31/318547 714/726 |
| 2009/0271671 A1 | 10/2009 | Kusko et al. |
| 2010/0102825 A1 | 4/2010 | Bushnell et al. |
| 2012/0304030 A1 | 11/2012 | Haufe |
| 2016/0245863 A1* | 8/2016 | Mrugalski .......... G01R 31/3187 |
| 2018/0017622 A1 | 1/2018 | Rajski et al. |

OTHER PUBLICATIONS

Chang et al., "Reducing Test Point Overhead with Don't-Cares" IEEE, 2012, 4 pages.

Chickermane, et al., "Non-Scan Design-for-Testability Techniques for Sequential Circuits" IEEE, 1993, 6 pages.

Ravi et al., "High-Level Test Synthesis: a Survey from Synthesis Process Flow Perspetive" ACM Transactions on Design Automation of Electronic Systems, vol. 19, No. 4, Article 38, Pub. date: Aug. 2014, 27 pages.

Savaria et al., "Automatic Test Point Insertion for Pseudo-Random Testing", IEEE, 1960, 4 pages.

Touba et al., "Test Point Insertion Based on Path Tracing", IEEE, 1996, 7 pages.

Yang et al., "Test Point Insertion with Control Points Driven by Existing Functional Flip-Flops", IEEE Transactions on Computers, vol. 61, No. 10, Oct. 2012, 11 pages.

Yokoyama, et al, "Random pattern testable design with partial circuit duplication" IEEE, 1997, 6 pages.

List of IBM Patents or Patent Applictions Treated As Related; (Appendix P), Filed Nov. 8, 2017, 2 pages.

Raghu G. GopalaKrishnaSetty, et al., Pending U.S. Appl. No. 15/806,388 entitled "Circuit Structures to Resolve Random Testability," filed with the U.S. Patent and Trademark Office on Nov. 8, 2017.

* cited by examiner

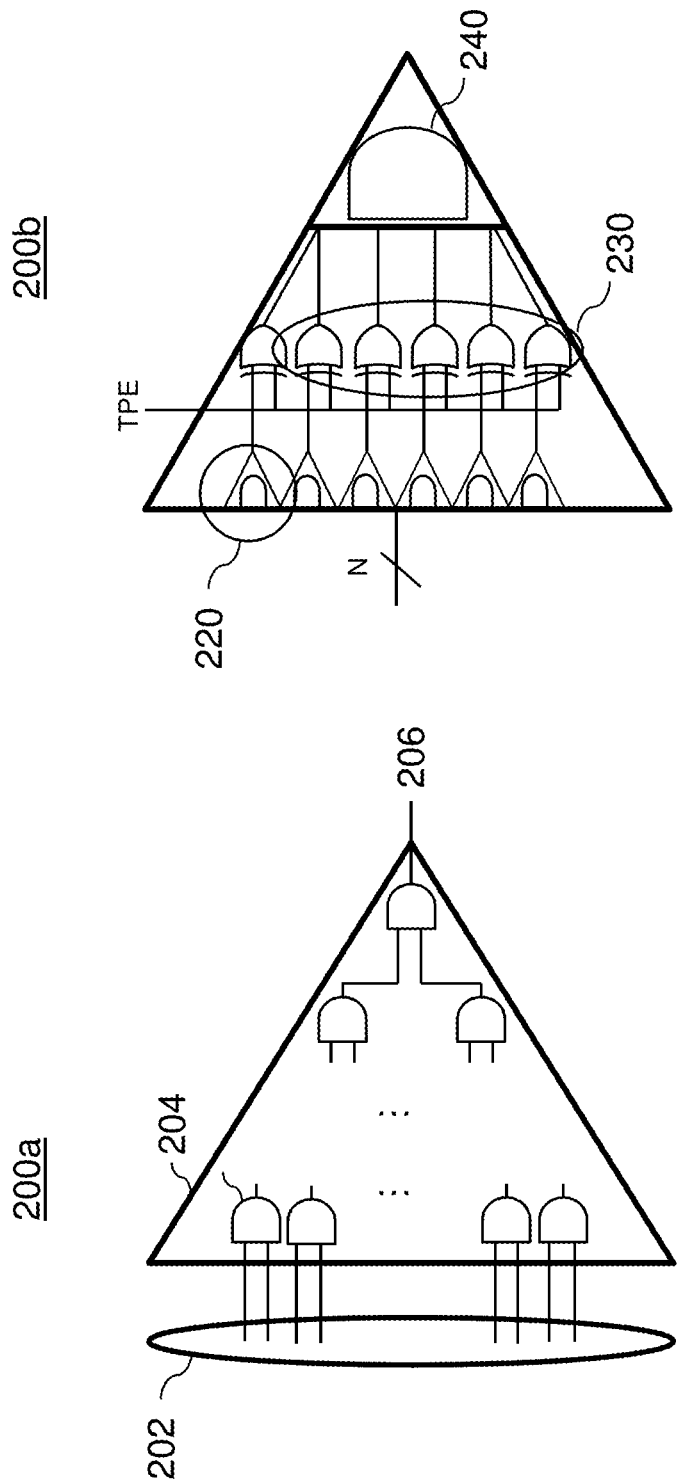

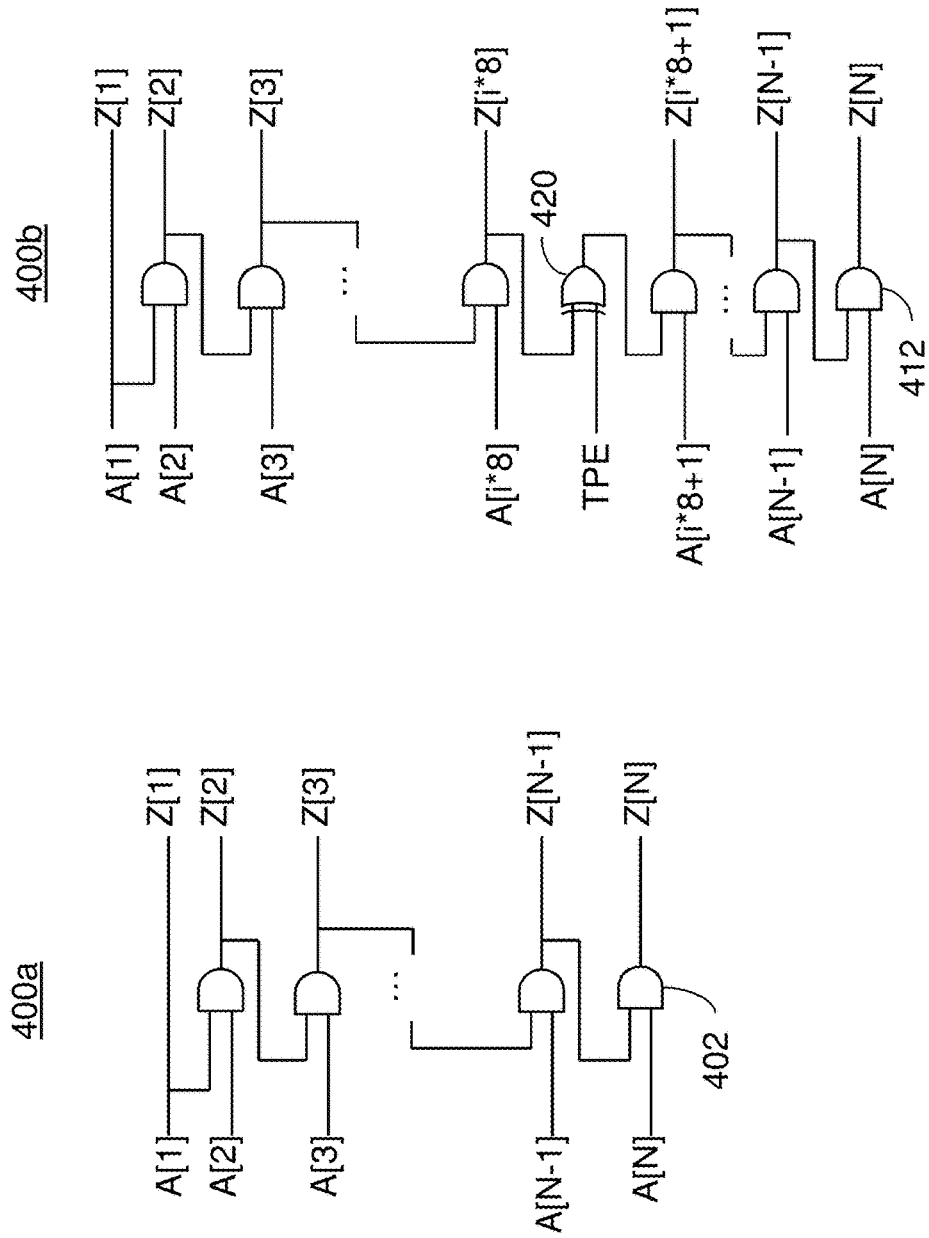

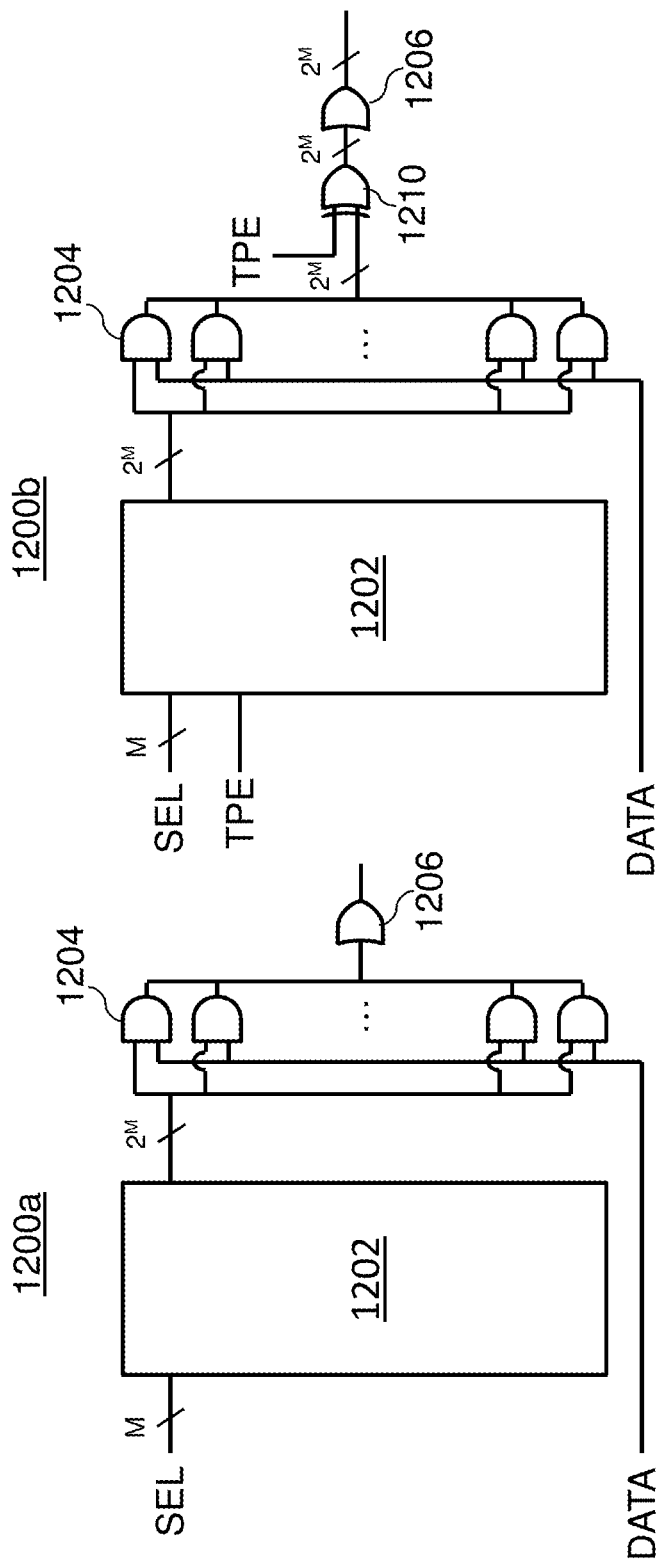

CIRCUIT STRUCTURES TO RESOLVE RANDOM TESTABILITY

BACKGROUND

The present invention generally relates to integrated circuit (IC) device testing techniques, and more specifically, to using circuit structures to resolve random testability.

In today's environment, there are techniques available to execute the testing of a circuit design. The tests can be designed to test the integrity of the circuit design. Random patterns can be generated to produce inputs that are used to test for potential faults. Other techniques include using a brute force test which produces each and every combination of inputs for the test. However, as circuit designs become more and more complex, the number of patterns that need to be generated and tested can become prohibitive and unworkable.

SUMMARY

Embodiments of the present invention are directed to a computer-implemented method for using circuit structures to solve random testability. A non-limiting example of the computer-implemented method includes analyzing logic structures of a circuit design, and identifying the logic structures of the circuit design that are random resistant structures. The method also includes replacing the identified logic structures with random testable structures, and performing a test of the circuit design including the random testable structures.

Embodiments of the present invention are directed to a system for using circuit structures to solve random testability. A non-limiting example of the system includes a processor configured to analyze logic structures of a circuit design, and identify the logic structures of the circuit design that are random resistant structures. The processor is further configured to replace the identified logic structures with random testable structures, and perform a test of the circuit design including the random testable structures.

Embodiments of the invention are directed to a computer program product for using circuit structures to solve random testability, the computer program product comprising a computer readable storage medium having program instructions embodied therewith. The program instructions are executable by a processor to cause the processor to perform a method. A non-limiting example of the method includes analyzing logic structures of a circuit design, and identifying the logic structures of the circuit design that are random resistant structures. The method also includes replacing the identified logic structures with random testable structures, and performing a test of the circuit design including the random testable structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2a and 2b depict diagrams for random resistant and random testable structures for using circuit structures to resolve random testability according to one or more embodiments;

FIGS. 4a and 4b depict diagrams for random resistant and random testable structures for using circuit structures to resolve random testability according to one or more embodiments;

FIGS. 12a and 12b depict diagrams for random resistant and random testable structures for using circuit structures to resolve random testability according to one or more embodiments;

Figure 1:
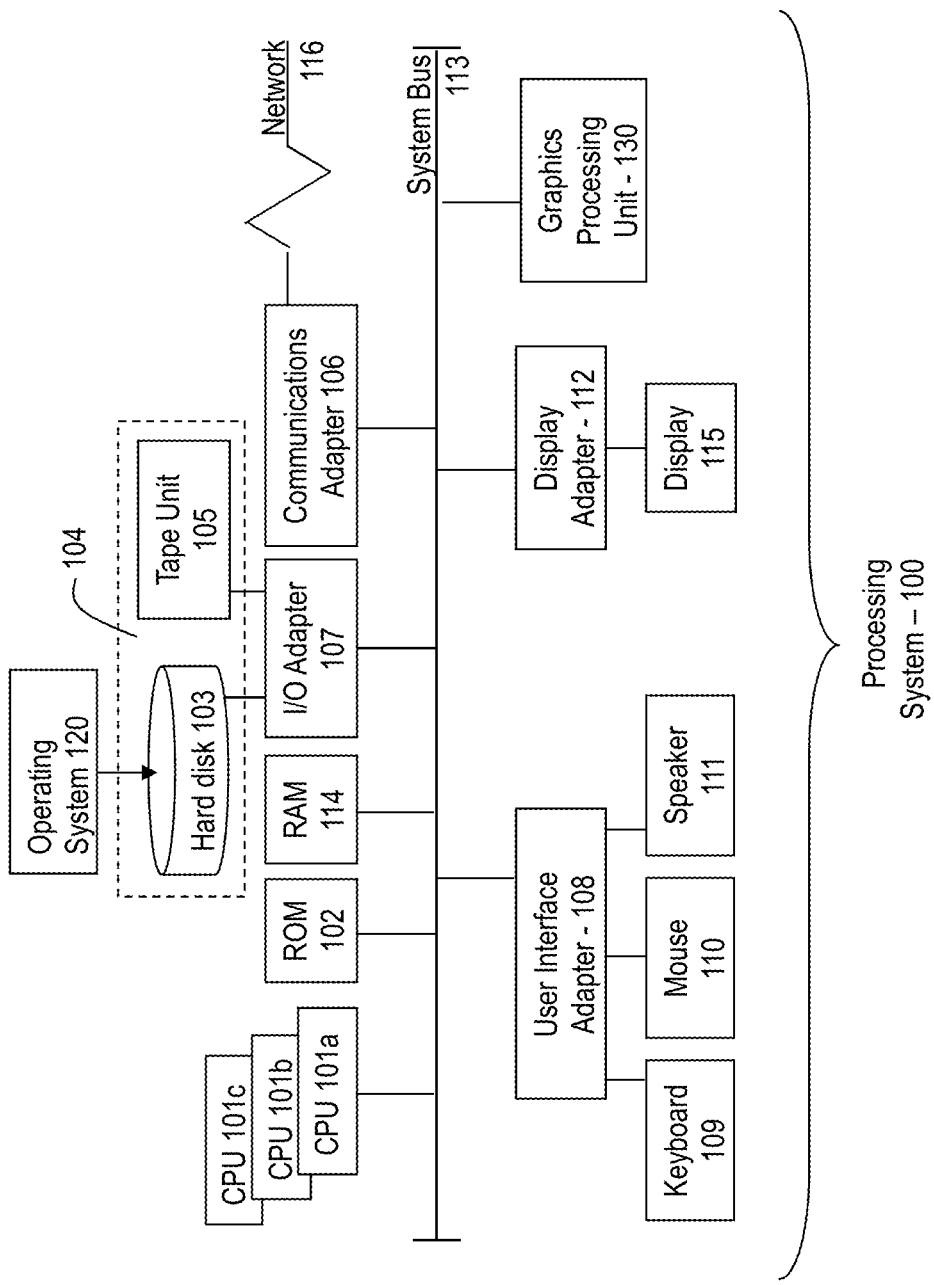
FIG. 1 depicts a block diagram illustrating one example of a processing system for practice of the teachings herein.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

One technique used to test for faults in a circuit design include stuck-at faults that mimic manufacturing defects within an integrated circuit. Individual signals and pins are assumed to be stuck at logical '1', '0' and 'x.' During a test the input is tied to a logical 1 state to assure that a manufacturing defect with a particular type of behavior can be found with a specific test pattern. Likewise, the input could be tied to a logical 0 to model the behavior of a defective circuit that cannot switch its output pin.

Complex combinational logic circuits must be reduced without changing the function of the circuit. Reduction of a logic circuit provides the same logic function with fewer gates and/or inputs. This simplifies the circuit such as providing the same logic function with fewer gates and/or inputs.

Current methods solve random resistance by analyzing the design for nets with a low probability of 0 and 1. In addition, traditional techniques require significant computation time to analyze the circuit. The current techniques also have no awareness of the logic structures of the circuit design. A test is simply run without regard to the logical structures that are used. Modification in the hardware description language (HDL) can alter solutions ineffective.

In addition, traditional techniques insert one or more test points increases the testability with regards to fault coverage however at the cost of performance which adds delay. Additional hardware is needed to form the test points, including observation and control points, which add area and performance overhead to a design.

Various logic structures are by nature random resistant. A non-limiting example of these logic structures include large decoders, equivalence checks, reduction logic (large AND or large OR), etc. As logic becomes more complex and requires more inputs the testability of the circuit design can become more difficult to test. In addition, as designs become more complex the more improbable it becomes to test each and every pattern of inputs.

Challenges exist in the presence of random-pattern-resistant faults which have low detection probabilities and hence may limit the fault coverage that can be achieved with pseudorandom patterns. For example, an AND gate having 16 inputs will only produce a logic 1 when each and every input is a 1, which makes large AND circuits random resistant.

The longest combinational path delay is referred to as the critical path, which determines the shortest clock period. A delay fault means that the delay of one or more paths exceeds the clock period. The critical path is the set of logic gates that determine the longest time. In one or more traditional techniques, the original timing path is shortened during the test. It is probable that the shortened timing paths will not trigger the critical path delay.

Turning now to an overview of the aspects of the invention, one or more embodiments of the invention address the above-described shortcomings of the prior art by providing one or more embodiments that replace random resistant structures with random testable structures, instead of simply adding test points or observation points to the circuit design.

The techniques described herein include replacing the random resistant logic in order to allow the detection of faults. Random resistant logic includes various known structures such as large/wide AND gates. By implementing invertors in the middle of the structure allows a fault to get propagated or excited in the structure. In one or more embodiments, multiple structures can be proposed to accomplish the testability. In addition, in order for the downstream circuits that are coupled to the logic circuit to be tested may require a certain output to activate the downstream circuit. If the particular output is never realized, there will be no way to test activate and test the output circuit.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1.

Now referring to FIG. 2a, a random resistant structure 200a providing testability challenges is shown. For example, FIG. 2a provides an example of a large AND circuit 204 having a plurality of inputs 202. The large AND circuit 204 includes a plurality of connected AND gates which can be organized in a one or more levels. For example, the first level providing the inputs 202 to the large AND circuit 204. In order to trigger or test an output 206 of the large AND circuit 204, a very specific set of inputs is required which achieving them by random numbers is unlikely. In order for the output 206 to result in a logic 1, each and every single input 202 must be a 1. As the number of inputs are increased the more random resistant a structure becomes. In a non-limiting example, a large or wide AND/OR reduction can have 16 or more inputs where the probability of achieving an output becomes 0. The more and more inputs the large AND circuit 204 has the more random resistant the structure becomes. In another non-limiting example, large OR gates having several inputs provide a similar random resistance as the large AND gate 204 described above. As a non-limiting example, inversions can be used for wide reduction, equivalence, inequivalence, cascade circuits, decoders, comparators, multiplexers, etc.

In an example, random resistant structures require a specific set of inputs to test which is difficult to achieve and test with random inputs. In one or more embodiments, an inversion is used to make random resistant structures random testable. By increasing the probability of propagating a signal (fault), the testability of the circuit dramatically increases.

Now referring to FIG. 2b, a random testable structure 200b to resolve random testability without fault delay in accordance with one or more embodiments is shown. In one or more embodiments, the random resistant structure of FIG. 2a can be detected and replaced with the random testable structure shown in 2b, wherein N represents a number of inputs. The example illustrated in FIG. 2b provides a technique for testing the AND reduction 220. A layer of invertors 230 are positioned between the first plurality of AND reductions and the large AND reduction 240. In one or more embodiments, the invertors 230 are exclusive OR gates (XOR). The invertors are configured to receive a test point enable (TPE) signal to excite faults and/or propagate faults through the circuit design during testing.

By using the invertors to increase the probability of propagating a signal (fault) the testability of the circuit design increases. The invertors are disabled during operation and enabled during a test. Because the invertors are disabled during normal operation there is no additional power consumed when powered off. By implementing the techniques described herein, small delay faults are still detected, in contrast to traditional test points which mask the small delay faults, where adding control points shorten the critical path and skew the delays associated with the path.

Figure 3B:
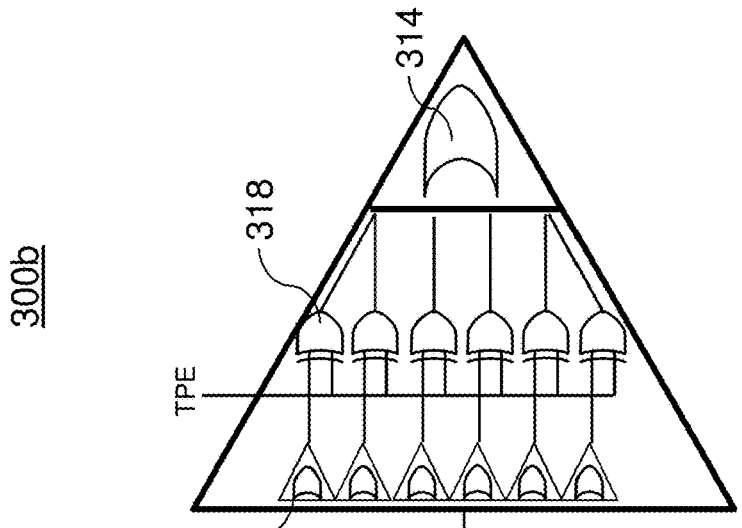
FIGS. 3a and 3b depict diagrams for random testable structures for using circuit structures to resolve random testability according to one or more embodiments.
Figure 3A:
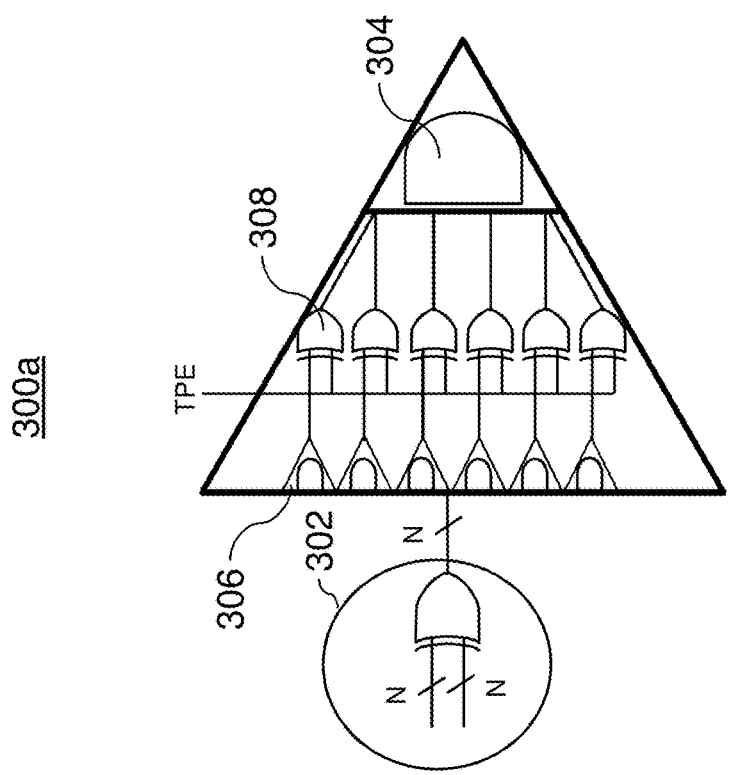

Now referring to FIG. 3a, a random testable structure 300a for an equivalence circuit used for solving the testability without fault delay in accordance with one or more embodiments is provided. The structure 300a is similar to the AND reduction provided in FIG. 2b which includes the AND reductions 304, the XORs 308, and the large AND reduction 304. However, the inputs 302 of the first level AND reductions 306 are XOR inputs. In addition, the AND reductions 304 and 306 are testable as illustrated in FIG. 2b. The input 302 XORs 302 are testable as long as the AND reductions are testable.

Now referring to FIG. 3b, a random testable structure 300b for an inequivalence circuit used for solving the testability without fault delay in accordance with one or more embodiments is provided. The random testable structure 300b is similar to that shown in FIG. 3a which includes the XNOR input 312. However, the first level reductions 316 are OR reductions, the middle layer is an XOR layer 318, and another OR reduction 314 is provided in the second level. The inputs to the OR reduction 316 are XORs which provides a circuit design 300b for an inequivalence circuit.

Now referring to FIG. 4a, a random resistant structure 400a is provided. Cascade reductions are difficult to test. Cascade reductions can either be OR and AND cascade reductions. The cascade AND reduction 400a as shown includes the plurality of inputs A[x] and plurality of outputs Z[x]. The cascade AND reduction structure 400a also includes a plurality of AND gates 402. The final output Z[N] resembles the configuration of a large AND or OR reduction of all of the signals.

In some embodiments, the reduction of the sub-signals (Z[1] through [N−1]) and by adding the invertors within the cascade configuration the entire cascade structure becomes testable. For example, XOR inversions can be implemented into the cascade as shown in FIG. 4b.

Now referring to FIG. 4b, a random testable structure 400b for using circuit structures to resolve random testability in accordance with one or more embodiments is provided. The cascade AND reduction structure 400b is similar to that shown in FIG. 4a. In one or more embodiments, cascaded structures can be identified in the circuit design and used to replace the random resistant structure of FIG. 4a. The cascade AND reduction 400b includes a plurality of inputs A[x] and outputs Z[x]. The cascade structure includes a plurality of AND gates 412 connecting each portion of the circuit. In addition, the cascade AND reduction 400b includes an invertor XOR gate 420 and receives a test signal TPE. By inserting the XOR gate 420 periodically, large cascades can be broken up into smaller ones. During testing the test signal TPE is used to either propagate and/or create a fault in the circuit for testing.

In one or more embodiments, an XOR inversion is placed in the cascaded structure to make the cascade testable. As shown in FIG. 4b the large cascade is broken into a smaller cascade. The TPE can be used to test to propagate the fault through the cascade. In one or more embodiments, the number of inversions that are placed in the cascade makes the circuit more testable.

Adding invertors, increases testability however, at the cost of increased delay (decreases performance). In one or more embodiments, large cascade chains can become random testable by inserting invertors in the chain. This structure can be used to replace the large chains to increase the testability circuit designs.

Figures 5A, 5B:
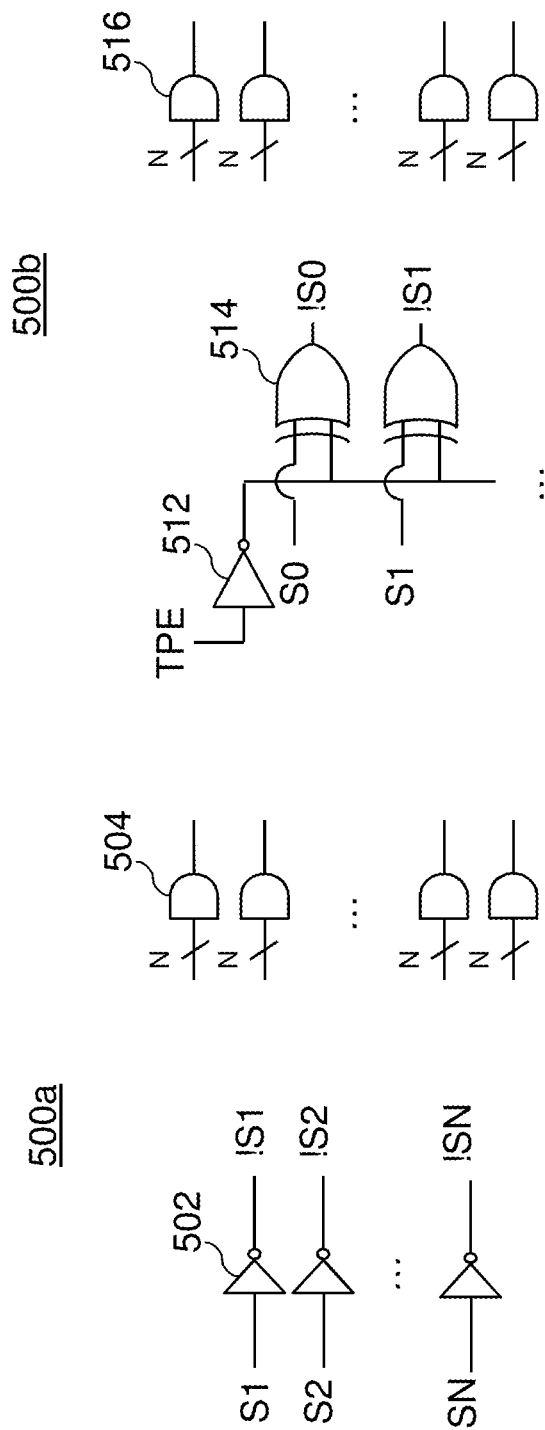
FIGS. 5a and 5b depict diagrams for random resistant and random testable structures for using circuit structures to resolve random testability according to one or more embodiments.

Now referring to FIG. 5a, a structure 500a for a decoder is shown. Decoders can be configured to receive a plurality of inputs and select signals SNs, where the select signal are used to determine a set of outputs for the decoder. The decoders are also configured to receive a DATA signal as an input. The one or more AND gates 504 receive signals from the inputs SN, where N represents a number of received signals.

FIG. 5a provides for a normal decoder the SEL signals are inverted by the invertor 502. The SEL signal SN after the inversion result in the complements of the SEL signal !SN which are then provided as inputs to the AND gates 504.

In one or more embodiments, a decoder can be expressed as a plurality of AND reduction because decoders share common signals. It must be determined if the combination of input signals is achieved or not. For decoders having a large number of select signals SN, many sizeable reductions can be created. In addition, although decoder reductions may be small, many branches will be created, leading to many untested faults. In one or more embodiments, select signal are inverted in a normal decoder. In order to implement the testing of the decoders the inputs are conditionally inverted.

Now referring to FIG. 5b, a random testable structure for a decoder 500b for resolving random testability in accordance with one or more embodiments. The decoder 500b representation is similar to that shown in FIG. 5a. However, the inputs to the XOR gates 514 include an invertor 512 that is configured to receive a TPE signal at an inversion which is then fed to the AND gates 516. In one or more embodiments, the SEL signals of the decoders can be conditionally inverted according to different scenarios.

During testing, each of the decoders can have the same function, and therefore, can be tested in parallel. By not inverting the select signals SN during testing, all reductions are testable using weighted random patterns.

Figure 6:
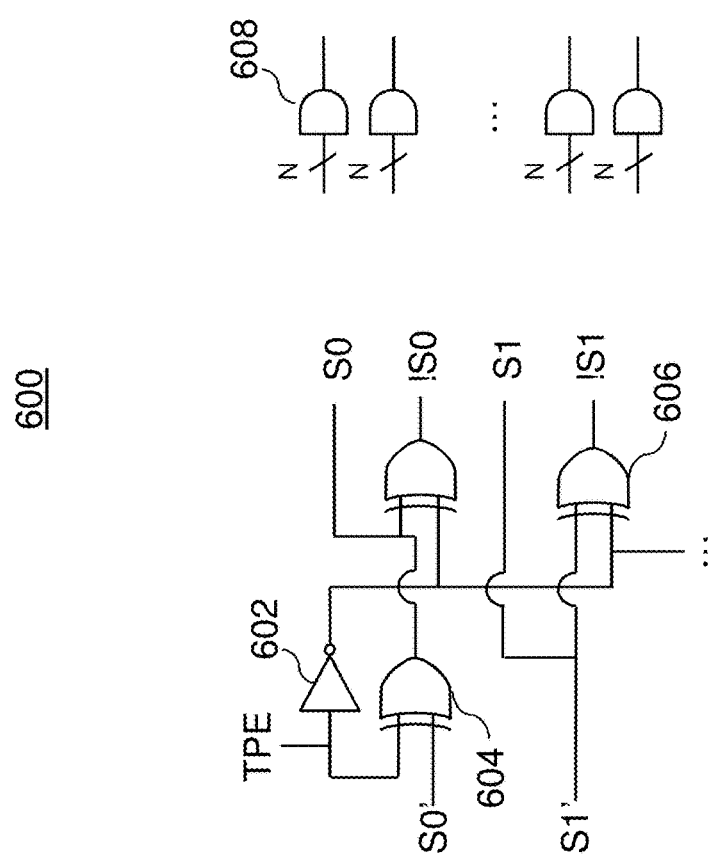
FIG. 6 depicts a diagram for random testable structures for using circuit structures to resolve random testability according to one or more embodiments.

Now referring to FIG. 6, a random testable structure 600 for a decoder used for solving random testability is provided. In one or more embodiments, the inputs to a decoder can be determined to be naturally weighted. In those scenarios, the inputs to be inverted during a test can be selectively chosen for inverting using the invertor 602 and XOR gate 604. FIG. 6 provides the input S0' is selectively inverted due to the a priori knowledge that the particular input is naturally weighted. If an input to a decoder is naturally weighted to an input, then we can selectively choose which inputs to invert during a test. The natural weighting of inputs can be determined by a number of previously run simulations. The inputs SN' are coupled to the XOR gates 606 which provide the inputs to the one or more AND gates 608.

Figure 7:
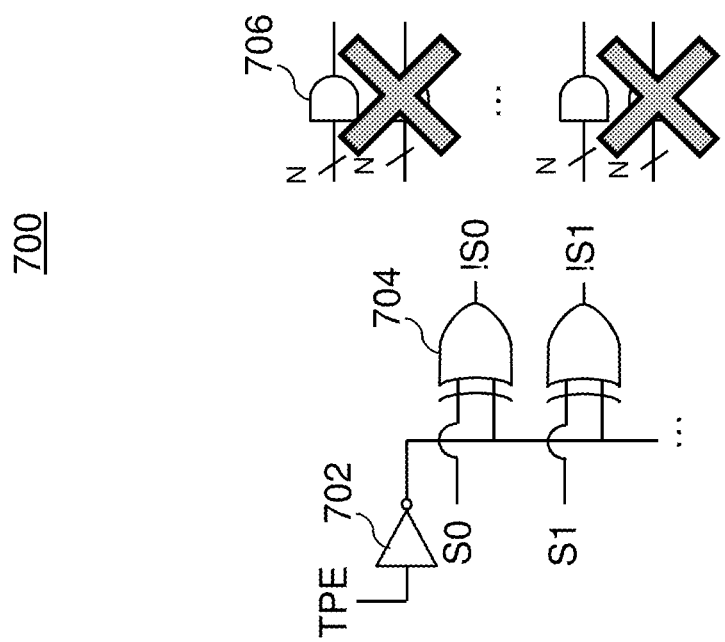
FIG. 7 depicts a diagram for random testable structures for using circuit structures to resolve random testability according to one or more embodiments.

Now referring to FIG. 7, a random testable structure 700 for a decoder used for solving random testability is provided. The structure 700 provides an invertor 702 configured to receive a TPE signal. In addition, the structure 700 includes XOR gates 704 used to conditionally invert the input signals fed to the plurality of AND gates 706. In the event, a portion of the decoders are not used they do not have to be instantiated and tested. They can simply be ignored during the test and are represented as a partial decoder. In this example, portions of the decoder are not instantiated in the representation as shown in FIG. 7. The "X" placed over the AND gates 706 indicate that the particular portion of the decoder is not required to be tested.

Figure 8:
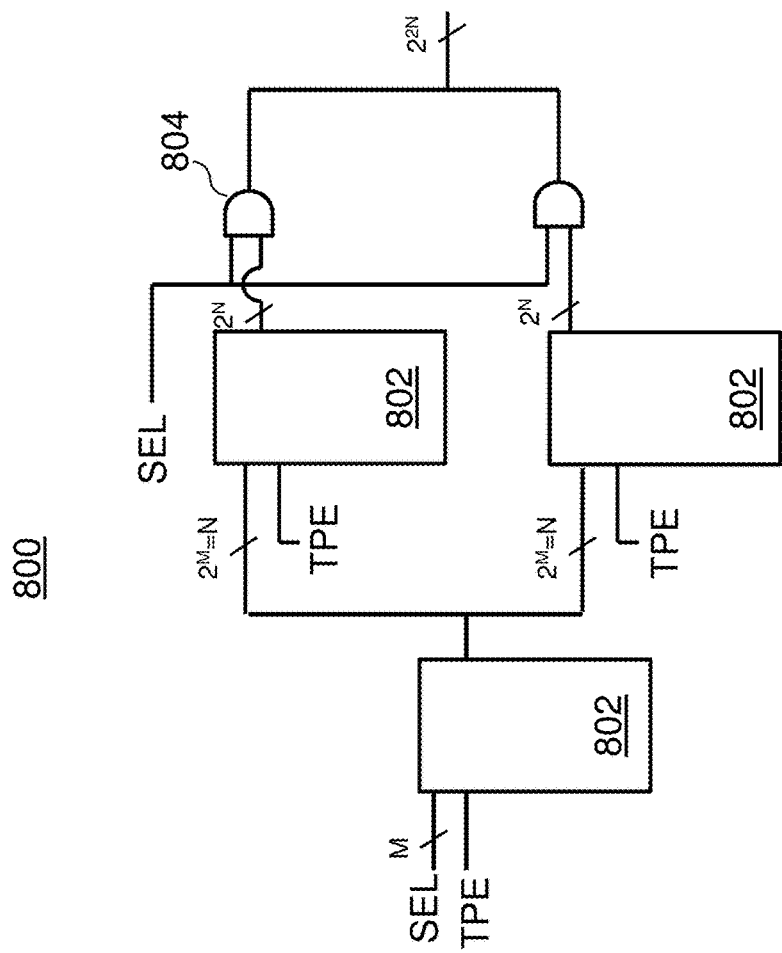
FIG. 8 depicts a diagram for random testable structures for using circuit structures to resolve random testability according to one or more embodiments.

Regarding partial decoders, situations arise where a portion of the entries of the decoder are not used. In these particular scenarios, the each and every AND gate is not required to be instantiated those instances. Therefore, those inputs do not need to be tested. However, in multi-level decoders, they can be made testable by using several testable decoders as shown in FIG. 8. Having multiple levels does not change the testability of the decoder.

Now referring to FIG. 8, a random testable structure 800 for a multiple level decoder used for solving random testability is provided. In one or more embodiments, decoders can be multi-level decoders. The decoders 802 are testable decoders, similar to that of FIG. 5b-7. The decoders 802 are configured to receive TPE signals for testing the structure. The output stage of the structure 800 is comprised of AND gates 804. In these embodiments, the multiple levels of decoders do not change the testability of the decoders. The multiple levels of the decoders 802 are now testable by controlling the TPE signals to conduct testing. In one or more embodiments, when a decoder is identified, the decoder select signals are inverted to configure a random testable circuit.

Figure 9:
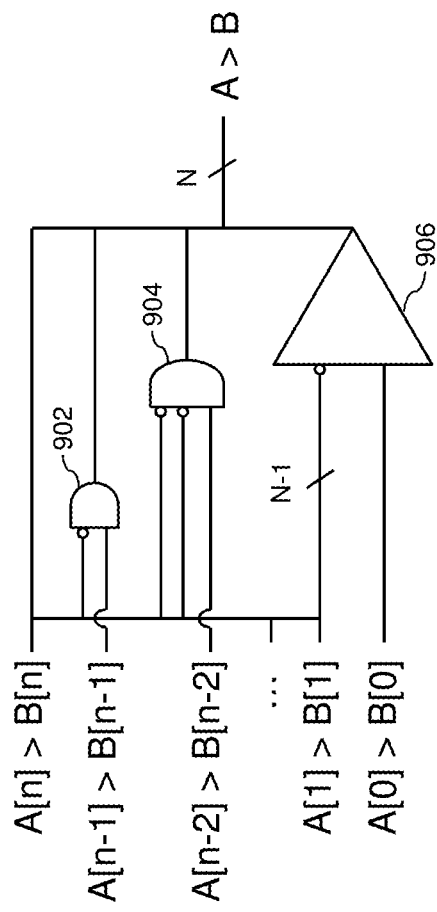
FIG. 9 depicts a diagram for random resistant structures for using circuit structures to resolve random testability according to one or more embodiments.
Figure 10:
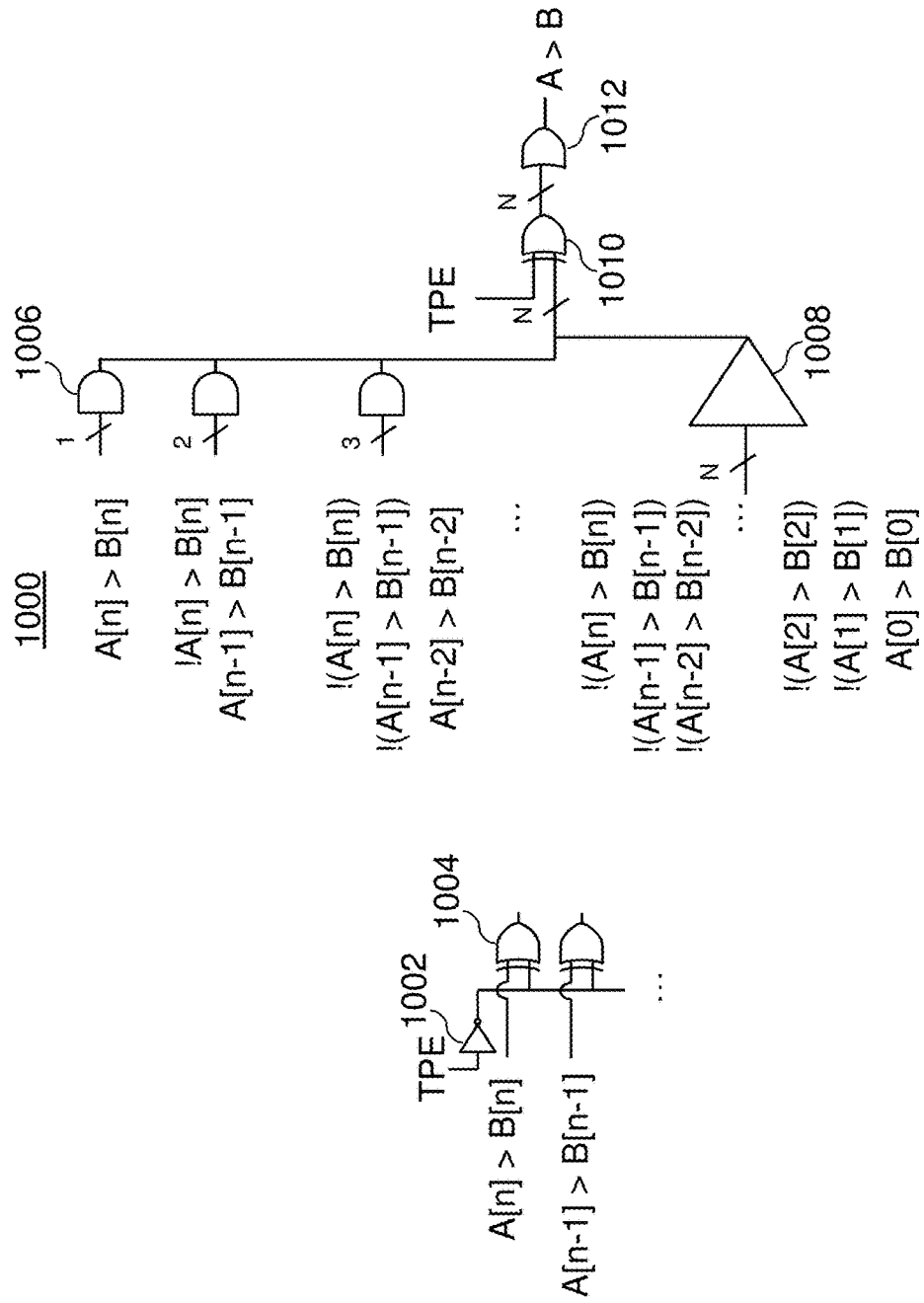
FIG. 10 depicts a diagram for random testable structures for using circuit structures to resolve random testability according to one or more embodiments.

Now referring to FIG. 9, a random resistant structure 900 for a comparator structure is provided. Comparators are functionally a series of large reductions. FIG. 10 makes the observation that the comparators are large reductions structured in a very particular manner. Comparators are used to compare two are more values and are random resistant structures. The comparator structure 900 includes a plurality of inputs that compare A[n] and B[n] which are received in combination at the AND gates 902 and 904, where are number of inputs are inverted. The comparator also includes an AND reduction 906 receiving a number (N−1) inputs and other inputs, where N is an integer greater than 0.

FIG. 9 makes the observation that all of the ANDs are using the same signals. The fact that we can weight naturally towards 1 or weighting naturally towards 0, as shown in the decoder example, we can turn off the inversion on the inputs which allow the AND reductions to be excited or not excited at the same time.

Simultaneously, we will invert all of the outputs of the ANDs during testing. For example, naturally weight the inputs A and B towards 1. This provides that all of the ANDs within the circuit are going to be a 1 during a test, then inverts the outputs of all the ANDs.

In the event a fault exists in the ANDs it will likely be 0 out the output of the AND where the 0 will be inverted and propagated through to the second level OR. We are testing two reductions here, the first level AND reductions and the second level OR reductions. Testability mode tests the ANDs and normal functionality tests the ORs During normal operation the invertors are disabled (TPE=0), and during testing the invertors are enabled (TPE=1) to propagate and create faults for testing.

When enabled the first faults on the first level will be propagated through the invertors and the second level will be excited. The idea is to incorporate invertors into key locations to allow faults to be more likely to be propagated through the structures or allows faults to be excited in the structure.

Now referring to FIG. 10, a random testable structure 1000 for a comparator for solving random testability is provided. The inputs to the comparator including A[n]>B[n], A[n−1]>B[n−1], etc. are supplied to the XORs 1004, where the XORs 1004 also receive the TPE signal which is provided to the invertor 1002. The structure 1000 includes a plurality of AND gates 1006 and a AND reduction 1008. The AND gates 1006 and AND reduction 1008 receives the inputs and feeds the signal to the XOR 1010 which feeds the OR reduction 1012. The XOR 1010 is configured to receive a TPE signal for testing. In one or more embodiments, the random testable structure 1000 can be used to replace the random resistant structure of FIG. 9.

Figure 11A:
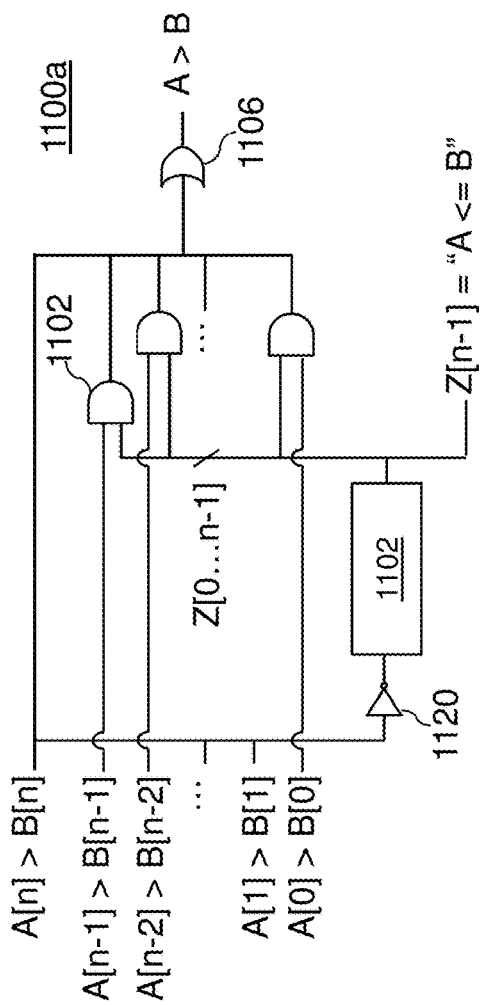
FIGS. 11a and 11b depict diagrams for random resistant and random testable structures for using circuit structures to resolve random testability according to one or more embodiments.

Now referring to FIG. 11a, a random resistant structure 1100a for comparator a having a cascade input 1102 is provided. The comparator 1100a as shown includes a cascade 4b. An alternate comparator implementation includes a cascade reduction as that of FIG. 10. The cascade 1102 received a signal from the invertor 1120. In addition, the inputs of the comparator 1100a are received at one or more AND gates 1102 and finally provided to the OR gate 1106.

Figure 11B:
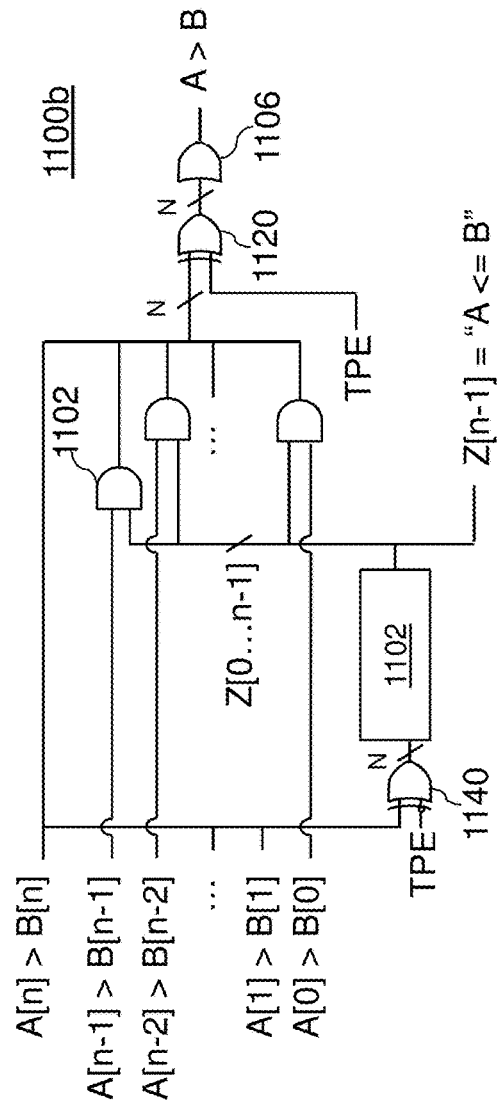

Now referring to FIG. 11b, a random testable structure 1100b for a comparator used for solving random testability is provided. The comparator 1100b is similar to the comparator shown in FIG. 11a. However, the comparator 1100b includes an XOR 1140 that is configured to receive the TPE signal for testing. In addition, the one or more AND gates 1102 are coupled to the XOR 1122 which is coupled to the second level OR gate 1106. In one or more embodiments, the structure 1100b can be used to replace the random resistant structure as presented in FIG. 11a.

Now referring to FIG. 12a, a random resistant structure 1200a for a multiplexer is shown. The multiplexor 1200a can be expressed as a decoder 1202 supplying a number of inputs to one or more AND gates 1204, where the AND gates 1204 are further coupled to an OR gate 1206. The decoder 1202 is configured to receive one or more select signal inputs SEL, where M represents the number of inputs. The output of the decoder 1202 is fed into one or more AND gates 1204 and the output of the AND gates 1204 is provided to an OR gate 1206.

Now referring to FIG. 12b, a random testable structure 1200b for a multiplexer used for solving random testability in accordance with one or more embodiments is shown. The multiplexor 1200b provides a structure similar to 1200a for solve for random testability. The multiplexor 1200b additionally includes a test point enable TPE input signal and an XOR 1210 which is also configured to receive TPE signals at the output of the plurality of AND gates 1204 leading to the second level OR gate 1206. To solve the multiplexor, an inversion can be added to test the input to the second level OR gate. The TPE input signal is used to excite a fault in the decoder and inversion and its TPE signal is used to propagate any faults to the output.

Figure 13:
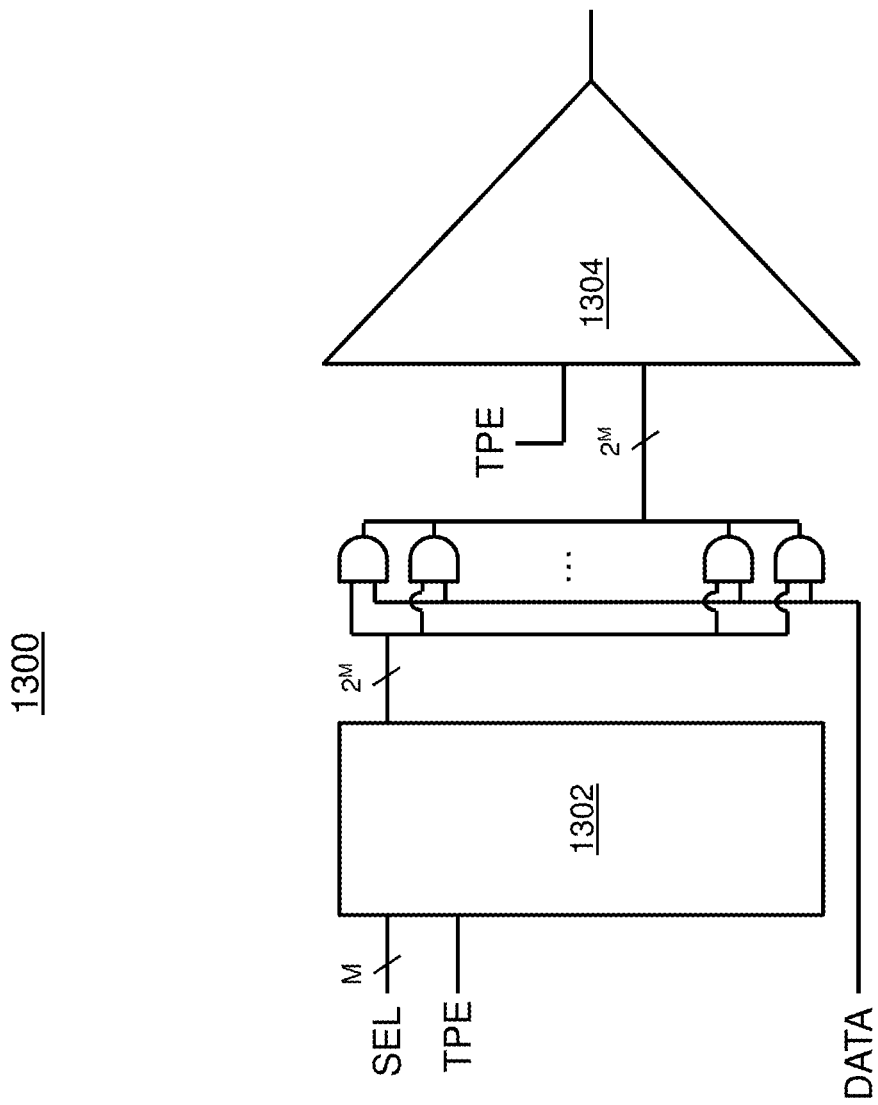
FIG. 13 depicts a diagram for random testable structures for using circuit structures to resolve random testability according to one or more embodiments.

Now referring to FIG. 13, another random testable structure 1300 for a multiplexor used for solving random testability in accordance with a different embodiment is shown. The multiplexor structure 1300 for replacing a random resistant structure 1200a is provided. The multiplexor structure 1300 is similar to that of FIG. 12b which includes the decoder 1302 receiving the SEL signals and TPE signals. However, the output stage utilizes a testable OR reduction 1304, instead of implementing an inversion as provided in the previous example. In one or more embodiments, the random resistant structure of FIG. 12a can be detected and replaced by the random testable structure 1300 of FIG. 13.

Figure 14:
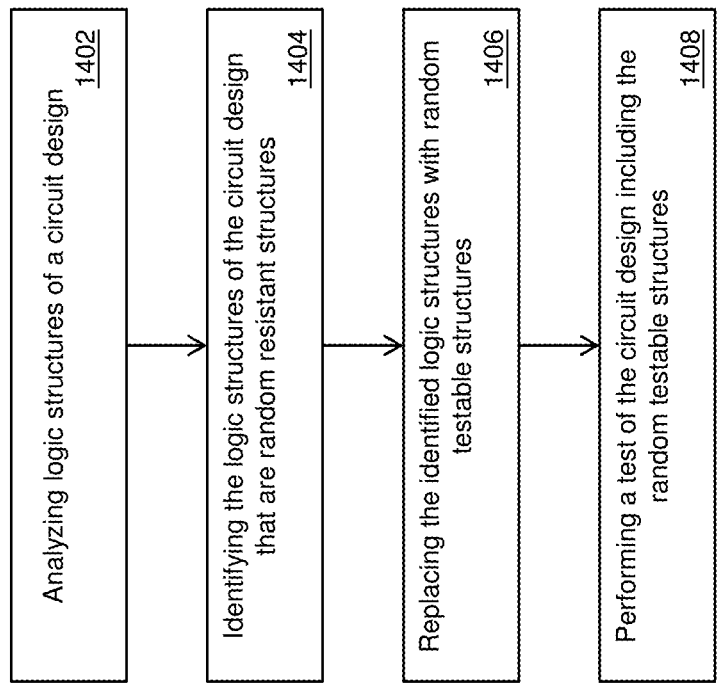
FIG. 14 depicts a flow diagram for using circuit structures to resolve random testability according to one or more embodiments.

Now referring to FIG. 14, a method 1400 for structurally solving random testability is shown. Block 1402 provides for analyzing logic structures of a circuit design. In one or more embodiments, the analysis is performed by reading a netlist or the HDL file associated with the circuit design.

Block 1404 provides identifying the logic structures of the circuit design that are random resistant structures. In one or more embodiments, the random resistant structures are those logic structures that require a very specific set of inputs that are not likely to be achieved using random numbers.

Block 1406 provides replacing the identified logic structures with random testable structures. In one or more embodiments, the random testable structures are substituted for random resistant structures which are very difficult to test. For example, as shown in FIG. 2a, a large (16-input) AND gate is replaced with the structure provided in FIG. 2b. The structure incorporates a level of invertors in the random resistant structure making the structure random testable. Instead of requiring a set of specific 16-inputs that are required to test the fault, the test mode can be used to propagate a signal through the structure to test the output. In another embodiment, large OR reductions can be tested similarly as the large AND reduction described above.

Block 1408 provides performing a test of the circuit design including the random testable structures. In one or more embodiments, the simulation includes enabling a test point enable signal in the circuit design to perform a test of the circuit design. The simulation allows faults to be excited and propagated through the random resistant structures to increase the probability of detection. By increasing the probability of the propagation of faults through the structure, testability dramatically increases.

Various logic structures are by nature random resistant. A non-limiting example of these logic structures include large decoders, equivalence checks, reduction logic (large AND or large OR), etc. Techniques to identify random resistant logic analyze designs for nets having a low probability of being a 0 or a 1. For example, large ANDs require a large number inputs to be the same to provide a 1. Testing this scenario can only be achieved with a limited number of inputs out of $2^n$ inputs.

In one or more embodiments, instead of adding test points or observation points, the random resistant structures are replaced by testable structures. The configurations are simplified and reduce the complexity. During a self-test, the data used for testing is developed on the chip by a random pattern generator.

Because the data is random, there is a 50% chance of a 0 or 1. In the logic, there are certain structures that are random resistant. For example, a 16-way AND gate. In order to have a stuck at 0, means the 16 inputs must be a 1. The logic that requires an input having a lot of 1s or 0s are random resistant. The techniques described herein allow for the testing of logic designs without shortening a critical path. Therefore, a more accurate measurement of a path delay can be determined.

The techniques that are described herein provide for the efficient testing of random resistant structure without additional fault delay. The techniques position invertors in key location to either propagate faults and/or generate faults for testing. The structures including the invertors are used to replace the random resistant structure during testing. This provides for a more efficient overall solution, automatic and repeatable, once HDL is updated, solution is persistent. Solution is correct by construction. Solution solves random testability without comprising testing of delay faults. These techniques solve random testability without compromising testing of delay faults.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A system for using circuit structures for resolving random testability, the system comprising:
   a storage medium, the storage medium being coupled to a processor;
   the processor configured to:
   analyze logic structures of a circuit design;
   identify the logic structures of the circuit design that are random resistant structures;
   responsive to identifying the logic structure as a decoder, selectively inverting inputs of the decoder based on a weighting of an input of the decoder;
   replace the identified logic structures with random testable structures; and
   perform a test of the circuit design including the random testable structures.

2. The system of claim 1, wherein the analyzing parses at least one of hardware description language (HDL), a logic entry source for logic structures of the circuit design, or a net list.

3. The system of claim 1, wherein the replacing comprises replacing the logic structure with known testable structures.

4. The system of claim 1, wherein the random resistant structures include at least one of an AND/OR reduction, equivalence structure, inequivalence structure, cascade structure, decoder, comparator, or multiplexor.

5. The system of claim 1, wherein a critical path is not shortened by the replacing of the random resistant structure.

6. A computer program product for using circuit structures for resolving random testability, the computer program product comprising:
   a computer readable storage medium having stored thereon first program instructions executable by a processor to cause the processor to:
   analyze logic structures of a circuit design;
   identify the logic structures of the circuit design that are random resistant structures;
   responsive to identifying the logic structure as a decoder, selectively inverting inputs of the decoder based on a weighting of an input of the decoder;
   replace the identified logic structures with random testable structures; and
   perform a test of the circuit design including the random testable structures.

7. The computer program product of claim 6, wherein the analyzing parses at least one of hardware description language (HDL), a logic entry source for logic structures of the circuit design, or a net list.

8. The computer program product of claim 6, wherein the replacing comprises replacing the logic structure with known testable structures.

9. The computer program product of claim 6, wherein the random resistant structures include at least one of an AND/OR reduction, equivalence structure, inequivalence structure, cascade structure, decoder, comparator, or multiplexor.

10. The computer program product of claim 6, wherein a critical path is not shortened by the replacing of the random resistant structure.

* * * * *